(12) United States Patent
Vaupel et al.

(10) Patent No.: US 9,196,535 B2
(45) Date of Patent: Nov. 24, 2015

(54) METHOD AND APPARATUS FOR SEPARATING SEMICONDUCTOR DEVICES FROM A WAFER

(71) Applicant: Infineon Technologies AG, Neubiberg (DE)

(72) Inventors: Mathias Vaupel, Regensburg (DE); Kurt Gehrig, Altdorf (DE); Kian Pin Queck, Melaka (MY)

(73) Assignee: INFINEON TECHNOLOGIES AG, Neubiberg (DE)

( * ) Notice: Subject to any disclaimer, the term of this patent is extended or adjusted under 35 U.S.C. 154(b) by 221 days.

(21) Appl. No.: 13/920,541

(22) Filed: Jun. 18, 2013

(65) Prior Publication Data

US 2014/0367015 A1    Dec. 18, 2014

(51) Int. Cl.
*B32B 38/10* (2006.01)
*H01L 21/78* (2006.01)
*H01L 21/67* (2006.01)
*H01L 21/683* (2006.01)

(52) U.S. Cl.
CPC .......... *H01L 21/78* (2013.01); *H01L 21/67017* (2013.01); *H01L 21/67092* (2013.01); *H01L 21/67098* (2013.01); *H01L 21/67132* (2013.01); *H01L 21/6836* (2013.01); *H01L 2221/6834* (2013.01); *H01L 2221/68322* (2013.01); *H01L 2221/68327* (2013.01); *H01L 2221/68368* (2013.01); *H01L 2221/68381* (2013.01); *Y10S 156/93* (2013.01); *Y10S 156/941* (2013.01); *Y10T 156/10* (2015.01); *Y10T 156/1121* (2015.01); *Y10T 156/1126* (2015.01); *Y10T 156/1137* (2015.01); *Y10T 156/1153* (2015.01); *Y10T 156/1911* (2015.01); *Y10T 156/1922* (2015.01); *Y10T 156/1939* (2015.01)

(58) Field of Classification Search
CPC .......... H01L 2221/68381; H01L 2221/68322; H01L 2221/68368; Y10T 156/1121; Y10T 156/1137; Y10T 156/1153; Y10T 156/1911; Y10T 156/1922; Y10T 156/1939
See application file for complete search history.

(56) References Cited

U.S. PATENT DOCUMENTS

| | | | |
|---|---|---|---|
| 5,154,793 A * | 10/1992 | Wojnarowski et al. | 156/711 |
| 6,521,853 B1 * | 2/2003 | Olson et al. | 209/571 |
| 7,067,030 B2 * | 6/2006 | Kiuchi et al. | 156/248 |
| 7,989,266 B2 * | 8/2011 | Borthakur et al. | 438/110 |
| 8,366,874 B2 * | 2/2013 | Meloni | 156/708 |
| 2002/0195199 A1 * | 12/2002 | Izutani et al. | 156/344 |
| 2006/0252233 A1 * | 11/2006 | Honma et al. | 438/464 |
| 2013/0084658 A1 | 4/2013 | Vaupel et al. | |

\* cited by examiner

*Primary Examiner* — Mark A Osele
(74) *Attorney, Agent, or Firm* — SpryIP, LLC

(57) ABSTRACT

An embodiment method for separating semiconductor devices from a wafer comprises using a carrier which acts an adjustable adhesive force upon the semiconductor devices and removing the semiconductor devices from the carrier by applying a mechanical or acoustical impulse to the carrier.

16 Claims, 7 Drawing Sheets

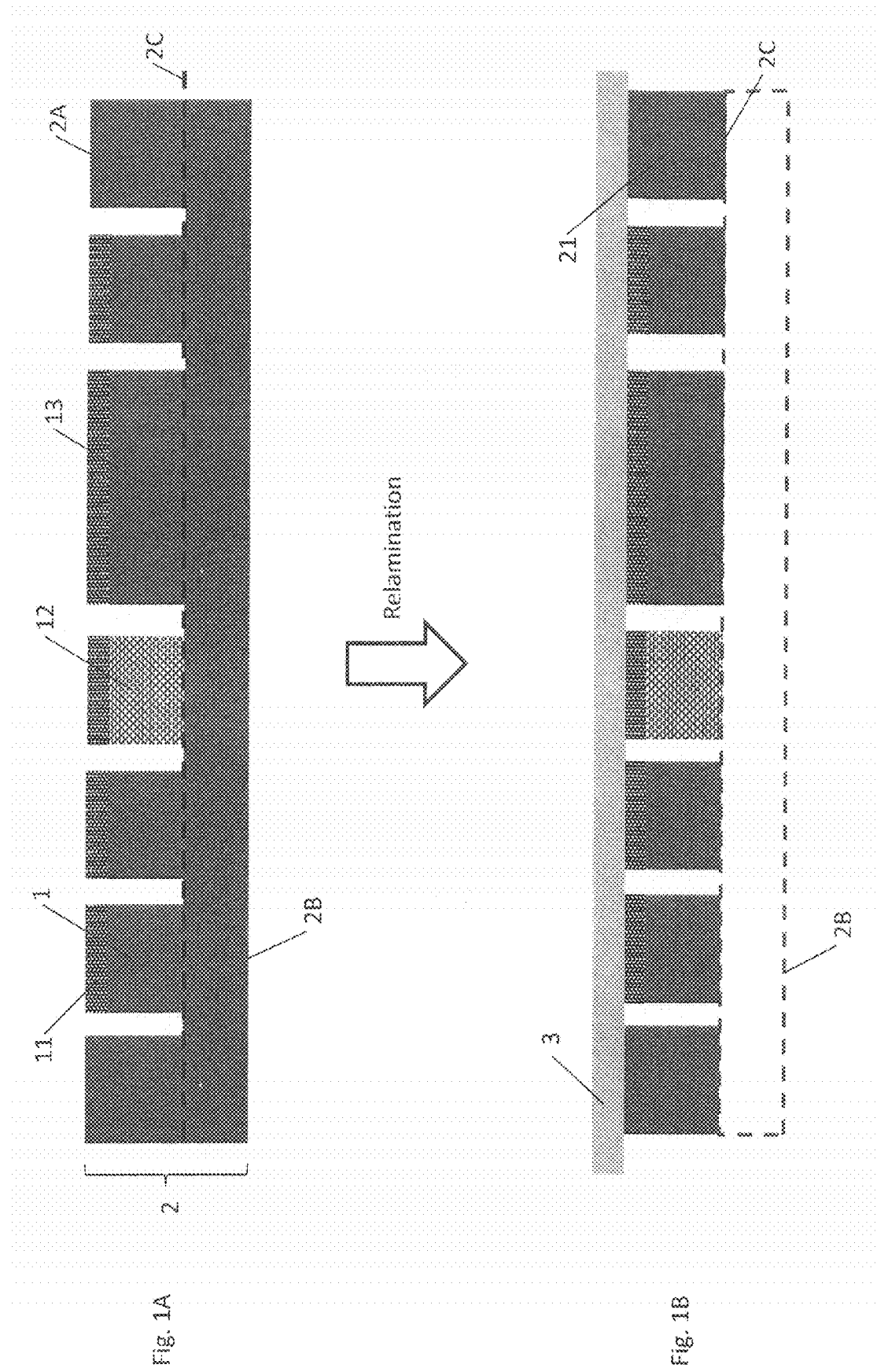

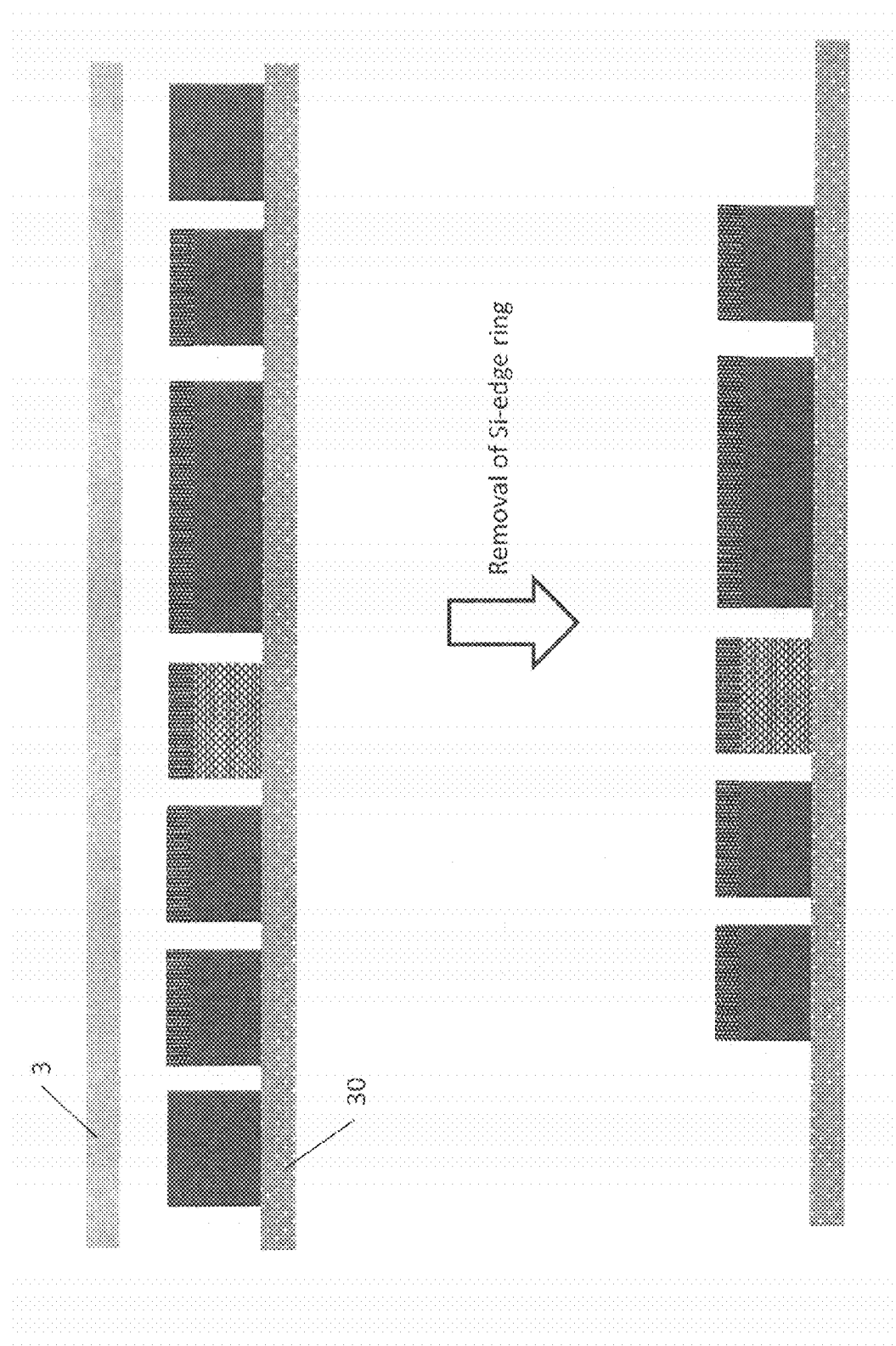

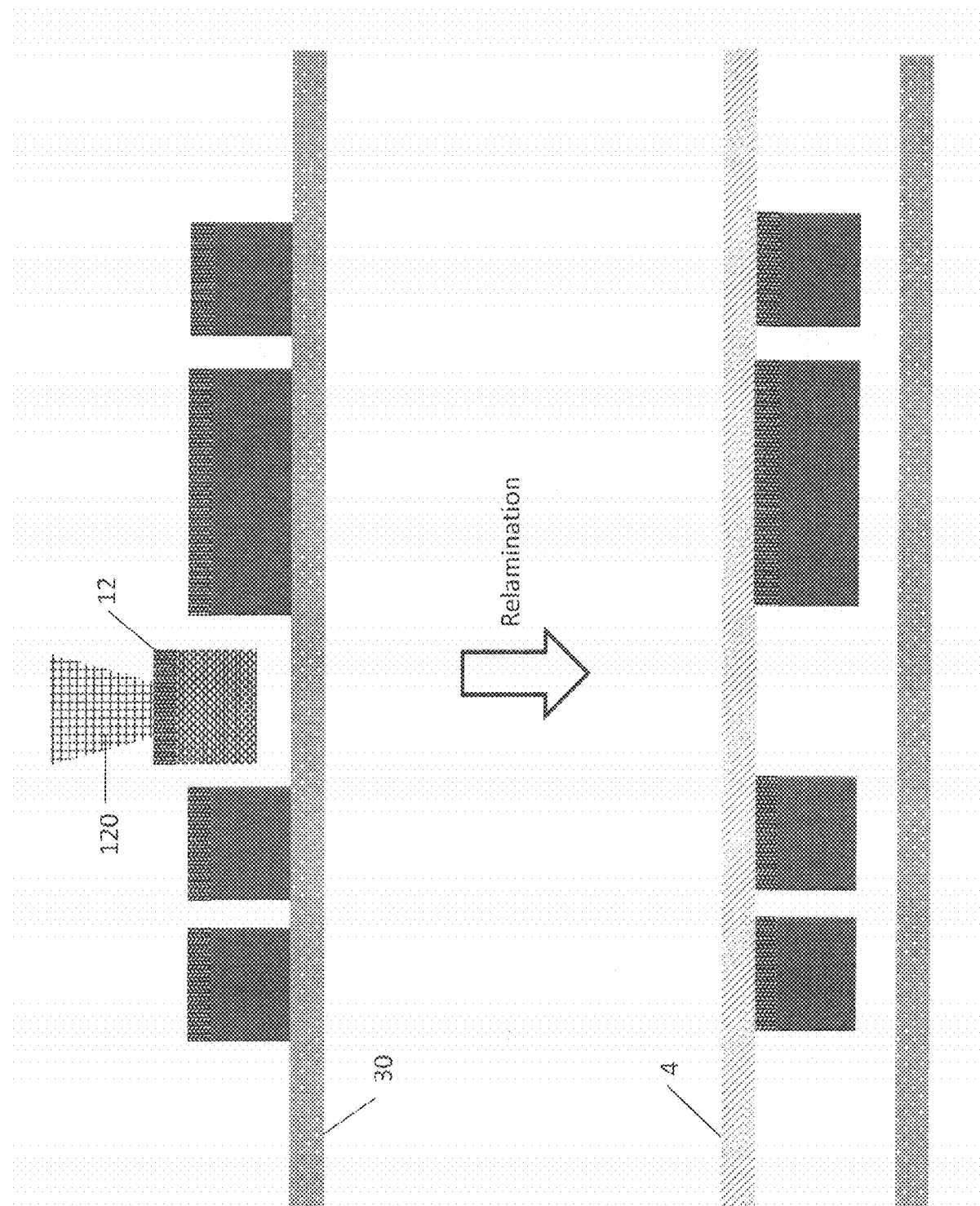

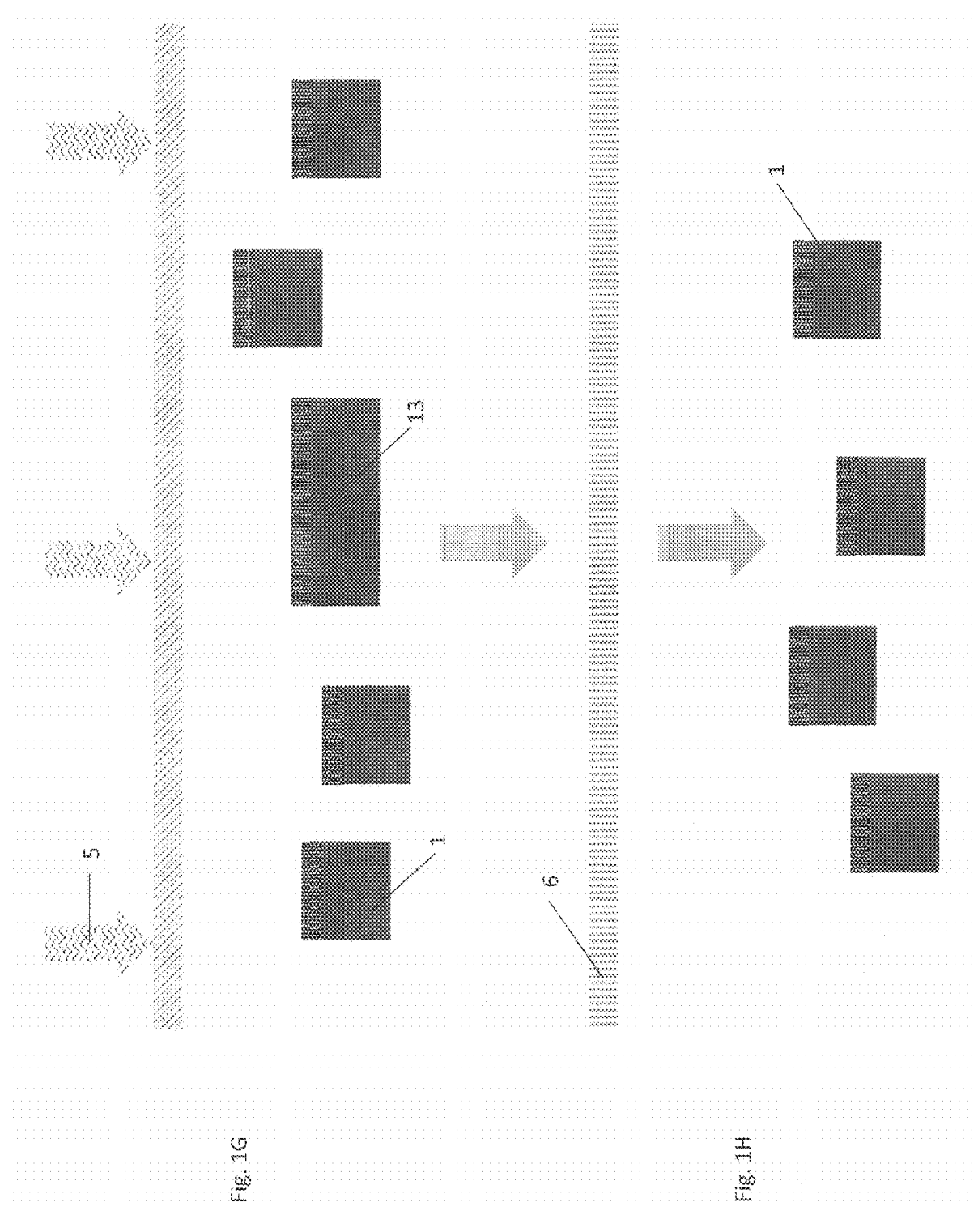

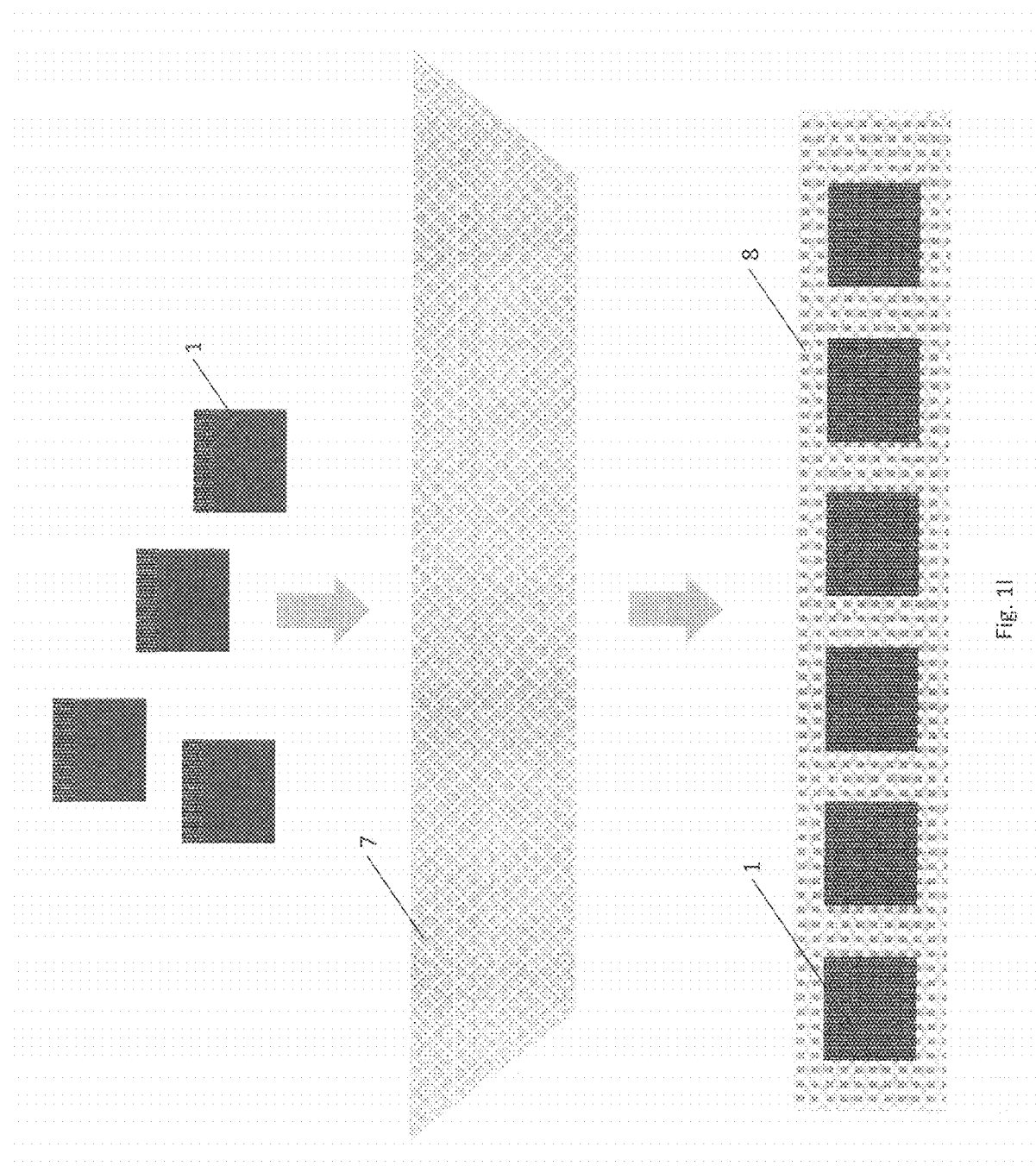

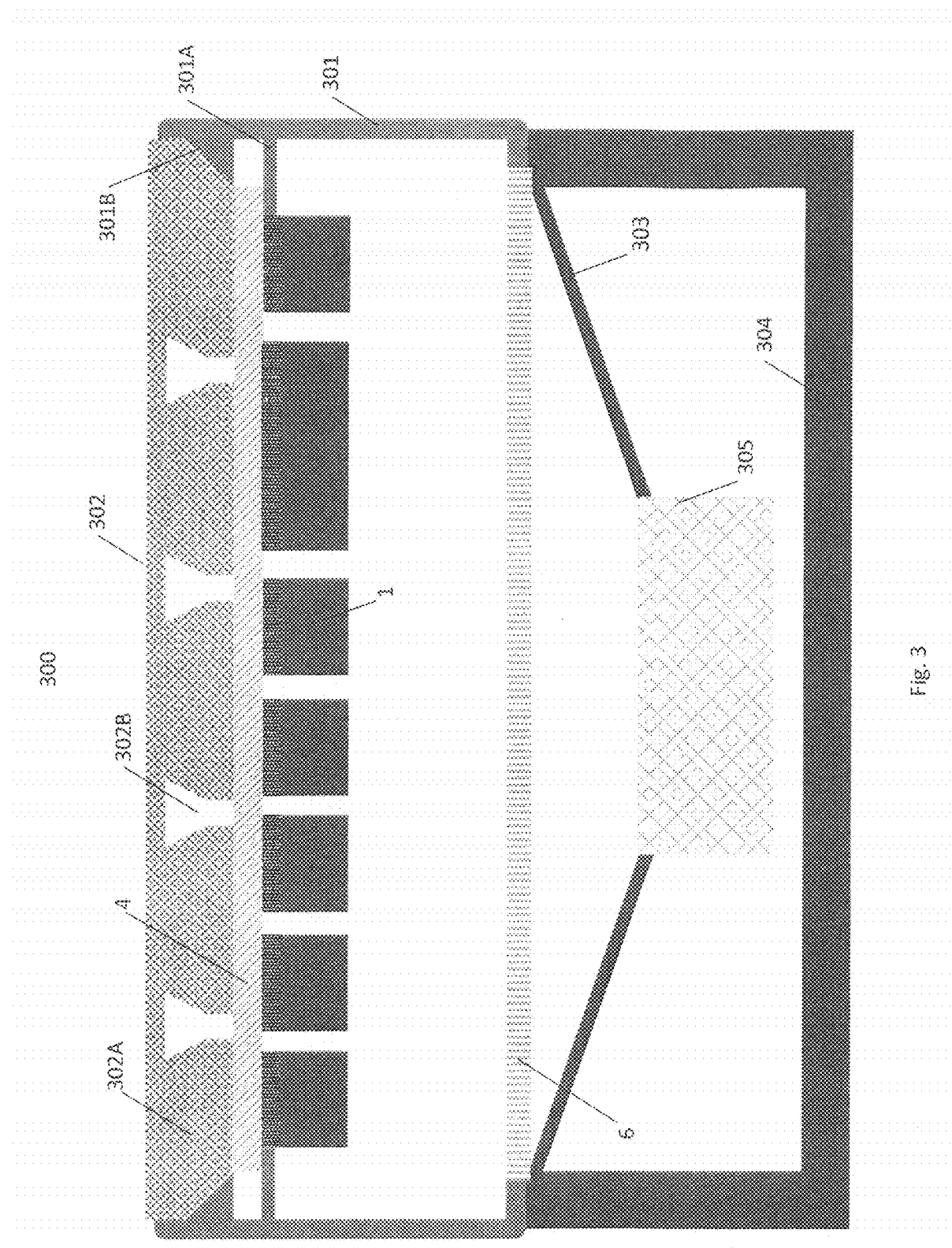

METHOD AND APPARATUS FOR SEPARATING SEMICONDUCTOR DEVICES FROM A WAFER

BACKGROUND

Semiconductor devices are fabricated from thin wafer layers. During the fabrication process, for example during separation of the wafer into individual semiconductor devices, the wafer may be attached to a carrier. For subsequent processing it may be necessary to separate the semiconductor devices from the carrier and to place them in a package or any other kind of transportable entity.

BRIEF DESCRIPTION OF THE SEVERAL VIEWS OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1, which includes FIGS. 1A-1I, depicts various stages of a process of separating semiconductor devices from a wafer.

FIG. 3 depicts an embodiment of an apparatus for separating semiconductor devices from a carrier.

DETAILED DESCRIPTION

Figure 2:
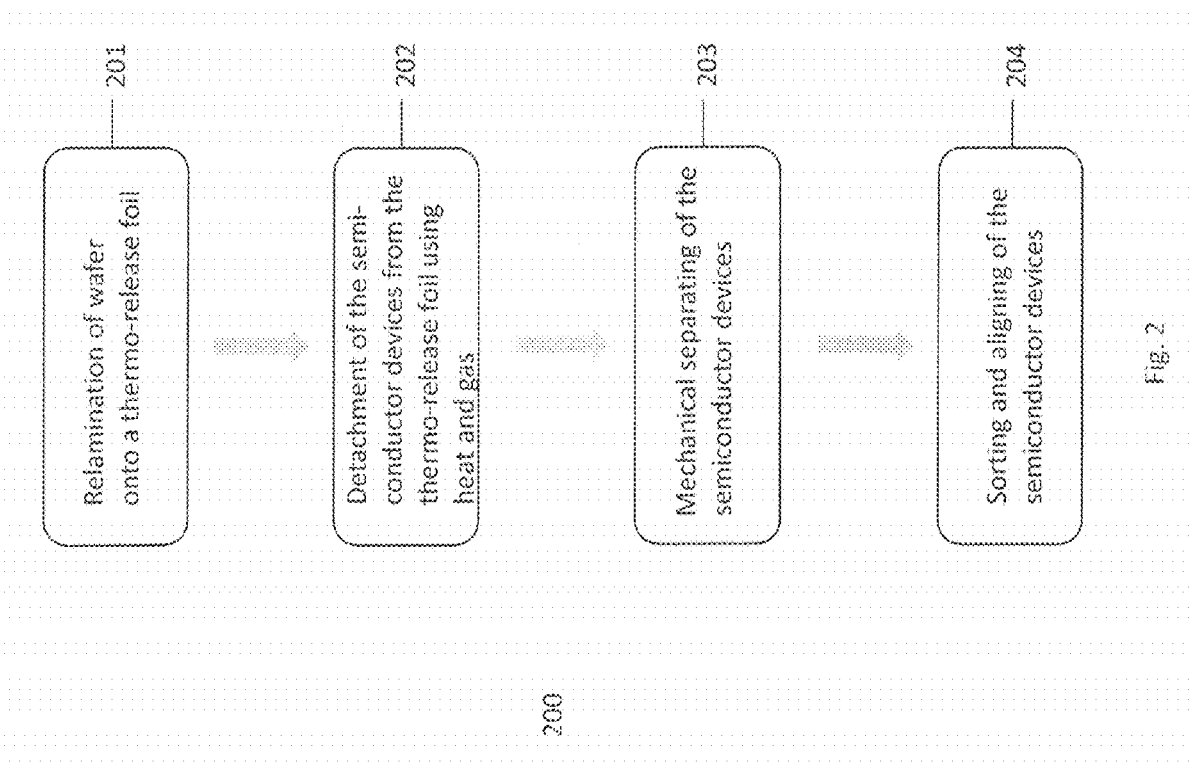
FIG. 2 depicts a flow diagram of an embodiment of a process for separating semiconductor devices from a carrier and transferring the semiconductor devices to another carrier.

The aspects and embodiments are now described with reference to the drawings. In the following description, for purposes of explanation, numerous specific details are set forth in order to provide a thorough understanding of one or more aspects of the embodiments. It is to be understood that other embodiments may be utilized and structural or logical changes may be made without departing from the scope of the described embodiments. It should be noted further that the drawings are not to scale or not necessarily to scale.

In the following detailed description, reference is made to the accompanying drawings, which form a part thereof, and in which specific embodiments are shown by way of illustration. It may be evident, however, to one skilled in the art that one or more aspects of the embodiments may be practiced with a lesser degree of the specific details. In other instances, known structures and elements are shown in schematic form in order to facilitate describing one or more aspects of the embodiments. In this regard, directional terminology, such as "top", "bottom", "left", "right", "upper", "lower" etc., is used with reference to the orientation of the Figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope is defined by the appended claims.

The semiconductor devices described further below may be of different types, may be manufactured by different technologies and may include for example integrated electrical, electro-optical or electro-mechanical circuits and/or passives, logic integrated circuits, control circuits, microprocessors, memory devices, etc.

The semiconductor devices can be manufactured from any semiconductor material like, for example Si, SiC, SiGe, GaAs, and, furthermore, may contain inorganic and/or organic materials that are not semiconductors, such as for example insulators, plastics or metals.

In the following a method for separating semiconductor devices from a wafer will be described using FIGS. 1 and 2.

During fabrication of semiconductor devices the semiconductor devices may be formed within a semiconductor wafer. The semiconductor devices comprise an active side which may comprise a single device such as a transistor according to an embodiment or an integrated circuit according to an embodiment. According to an embodiment a protective layer may be deposited onto the semiconductor devices. The protective layer may protect the individual semiconductor devices from environmental harms, for example during further handling of the semiconductor devices.

Wafers can be diced to fabricate individual semiconductor devices. According to an embodiment dicing is performed by sawing the wafer along predefined sawing streets. According to an embodiment sawing is performed using a mechanical saw. According to an embodiment dicing is performed by etching or by a combination of etching and sawing. According to an embodiment the semiconductor devices are not separated completely in the dicing step. That is, the semiconductor devices are still connected to a continuous part of the wafer that was not sawed or etched in the dicing step. The continuous part of the wafer is on the side opposite of the active side of the semiconductor devices.

The semiconductor devices may be subjected to a test of certain criteria. According to an embodiment testing is performed before the wafer is placed onto a carrier. Some semiconductor devices may not meet the test criteria and may be labeled as rejects for subsequent processing. Usually only a small fraction of the semiconductor devices on a wafer does not meet the test criteria.

Referring now to FIG. 1, various stages of a process of separating semiconductor devices from a carrier are shown. Note that FIGS. 1A-1I depict a cross sectional view of the stages of the process.

FIG. 1A depicts a wafer comprising semiconductor devices that may have been fabricated as described above. The semiconductor devices 1 may be arranged on the wafer 2 with a first side 2A, which may be called the front side of the wafer and a second side 2B, which may be called the back side. The active side 11 of the semiconductor devices may be the one on the front side. The semiconductor devices may be subjected to a test of certain criteria as mentioned above. The semiconductor devices that do not meet these criteria are labeled as rejects 12.

Furthermore, the wafer may comprise predetermined semiconductor devices 13 which have different dimensions than the majority of semiconductor devices 1 and may serve a different purpose. For example, in one embodiment the predetermined semiconductor devices 13 may be larger than the majority of the semiconductor devices 1.

Referring to FIG. 1B, a grinding tape 3 may be laminated onto the front side of the wafer. In other embodiments other suitable carriers may be used to fixate the wafer. The semiconductor devices may be singulated by grinding the back side 2B of the wafer to a plane 2C. Thus the individual semiconductor devices are physically separated. After grinding a wafer edge ring 21 may remain.

Referring to FIG. 1C, an adhesive foil may be laminated onto the new back side 2C of the wafer. The adhesive foil may be connected to a structural support to improve the stability of the adhesive foil. In other embodiments another suitable carrier may be used instead of the adhesive foil. In a next step the grinding tape may be removed from the front side of the wafer.

As shown in FIG. 1D, the wafer edge ring 21 may be removed from the adhesive foil.

As depicted in FIG. 1E, rejects 12 may be removed from the adhesive foil. Removal of rejects may, for example, be performed by nullifying the adhesion between the rejects and the adhesive foil using a laser. In another embodiment the rejects may be removed by mechanical picking 120.

In some embodiments the adhesive force between the adhesive foil and the wafer may be reduced by applying some outside influence to the adhesive foil. For example, in one embodiment the adhesive foil is a UV curable dicing tape and the adhesive force can be reduced by irradiating the UV curable dicing tape with UV light.

Referring to FIG. 1F, a carrier 4 may be attached to the front side of the semiconductor devices in one embodiment. In another embodiment a carrier may be attached to the back side of the semiconductor devices after laminating adhesive foil to the front side of the semiconductor devices and removing the adhesive foil from the back side in an additional lamination and delamination step. In yet another embodiment the carrier 4 instead of the adhesive foil shown in FIG. 1C may be attached to the back side 2C of the semiconductor devices.

An adhesive force of the carrier 4 can be adjusted by exposing the carrier to a certain condition depending on the specific type of the carrier.

The carrier maybe a thermo-release foil in one embodiment and may be a another suitable carrier in other embodiments.

UV curable dicing tapes can be used as carriers for semiconductor devices. An adhesive force of UV curable dicing tapes can be decreased by applying UV light to them. However, some non-zero adhesive force may remain after applying UV light.

An adhesive force of the thermo-release foil may be adjusted by applying heat to the thermo-release foil. For example, the adhesive force may be reduced to a value significantly lower than possible in UV curable dicing tapes or close to zero.

According to an embodiment the thermo-release foil is heated to a suitable temperature and for a suitable period of time to reduce the adhesive force of the foil. In particular the thermo-release foil may be heated to 120° C. for two minutes.

Applying heat can for example be done by using a hot plate. According to another embodiment heating can be performed using an infrared lamp. According to yet another embodiment heating can be performed using an oven or a hot air dryer. According to an embodiment heat is applied to the side of the carrier 4 that does not bear semiconductor devices.

Referring to FIG. 1G, a mechanical or acoustical impulse 5 may be applied to the carrier 4. According to an embodiment the mechanical or acoustical impulse is applied after applying heat to the thermo-release foil. According to an embodiment the mechanical or acoustical impulse is applied to the side of the carrier 4 that does not bear semiconductor devices.

According to an embodiment the mechanical or acoustical impulse is generated by directing one or more gas streams at the carrier 4. The gas can be air or another suitable gas like, for example, nitrogen or argon. According to an embodiment the gas is emitted in one or more pneumatic pulses. The pulses can be, for example, 0.5 to 5 seconds, in particular about 2 seconds long. According to an embodiment the gas jet or gas jets may be directed at the side of the carrier that does not bear semiconductor devices.

The mechanical or acoustical impulse may cause vibrations in the carrier 4. Due to these vibrations some or all of the semiconductor devices may detach from the carrier after applying the mechanical or acoustical impulse. According to an embodiment all or close to all devices detach.

The pulsing application of the gas jets generates less acceleration than a continuous application and minimizes the risk of damaging the semiconductor devices separated from the carrier by them striking any surface.

According to an embodiment an acoustical impulse instead of a mechanical impulse may be used to detach the semiconductor devices from the carrier. The acoustical impulse can, for example, be generated using a sound output system.

Advantageously, by using gas jets to create the impulse no mechanical interaction with the thermo-release foil is necessary, which might damage the thermo-release foil.

Referring now to FIG. 1H, semiconductor devices detached from the carrier 4 may be transferred to a mechanical separating unit 6. The mechanical separating unit 6 is configured to isolate the predetermined semiconductor devices 13 from the semiconductor devices 1. In particular the mechanical separating unit 6 may be a sieve sporting openings with dimensions such that semiconductor devices 1 can pass through and predetermined semiconductor devices 13 can not.

Referring now to FIG. 1I, the semiconductor devices 1 may be transferred to an apparatus 7 which is configured to sort and align the semiconductor devices. According to an embodiment the apparatus is a bowl feeder and the semiconductor devices are aligned on a tape 8.

FIG. 2 depicts a flow diagram of a preferred embodiment of the method for separating semiconductor devices from a carrier described above. The method 200 comprises relaminating a wafer onto a thermo-release foil (201), detachment of the semiconductor devices from the thermo-release foil by applying heat and gas jets (202), mechanical separating of the semiconductor devices 203, and sorting and aligning of the semiconductor devices (204).

Advantageously, the method for separating semiconductor devices from a carrier described above is a fast, gentle and cheap process which may help to reduce costs in the fabrication of semiconductor devices. Due to the method being a parallel process (concurrent release of most or all semiconductor devices), it is faster than serial picking and placing processes. The described method produces no residues of any media and is environment-friendly and non-toxic.

FIG. 3 depicts a cross sectional view of an embodiment of an apparatus for separating semiconductor devices from a carrier.

The apparatus 300 comprises a bearing 301. The bearing comprises a carrier retainer 301A configured to receive a carrier 4 with semiconductor devices 1 attached to the carrier 4. The carrier 4 may be a thermo-release foil. The bearing 301 further comprises a fixture 301B configured to receive a module 302. The carrier retainer 301A and the fixture 301B are configured such that the module 302 is in close proximity to or touches the side of the carrier 4 where no semiconductor devices are attached.

The module 302 comprises a heating element 302A configured to heat the carrier 4. The module 302 further comprises one or more gas nozzles 302B configured to direct one or more gas jets at the carrier 4.

The heating element 302A may, for example, heat the carrier 4 to a suitable temperature for a suitable period of time to facilitate release of the semiconductor devices from the carrier 4. The gas nozzles may, for example, direct one or more gas pulses of about 2 seconds duration at the carrier.

In another embodiment the module 302 may comprise a sound output system configured to apply an acoustical impulse to the carrier 4 instead of gas nozzles.

The apparatus 300 further comprises a mechanical separating unit 6 configured such that semiconductor devices separated from the carrier by applying heat and air jets to the carrier fall onto the mechanical separating unit.

After passing the mechanical separating unit 6 the semiconductor devices fall into a cone 303 configured to transfer the semiconductor devices into a reservoir 305. According to an embodiment the reservoir is a transport container. According to an embodiment the semiconductor devices may be transferred directly into a bowl feeder instead of a transport container.

The apparatus further comprises a vibration unit 304 which is configured to vibrate the mechanical separating unit 6 and the cone 303. Vibrating may help to mechanically separate the semiconductor devices and to transfer them to the transport container.

The individual components of the apparatus, specifically the module 302, the mechanical separating unit 6, the cone 303 and the vibration unit 304 are configured such that the semiconductor devices are not damaged by excessive heat or excessive mechanical force. The dimensions of the apparatus are such that the drop height is small enough to minimize the risk of damaging the semiconductor devices.

The apparatus 300 may further comprise a manual bar code scanner configured to scan a bar code of the carrier 4 and the foil bag 305. The bar codes help to retrace the content of individual transport containers.

Although embodiments and advantages have been described in detail, it should be understood that various changes, substitutions and alterations can be made herein without departing from the spirit and scope of the invention as defined by the appended claims.

Moreover, the scope of the present application is not intended to be limited to the particular embodiments of the method and apparatus described in the specification. As one of ordinary skill in the art will readily appreciate from the disclosure of the embodiments, method and apparatus, presently existing or later to be developed, that perform substantially the same function or achieve substantially the same result as the corresponding embodiments described herein may be utilized according to the described embodiments. Accordingly, the appended claims are intended to include within their scope such methods and apparatus.

While embodiments have been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations.

What is claimed is:

1. A method for separating semiconductor devices from a wafer, the method comprising:
    arranging semiconductor devices on a carrier, the carrier including at least a thermo-release foil, and
    removing a plurality or all of the semiconductor devices from the carrier using a gas jet.

2. The method of claim 1, further comprising providing an adjustable adhesion force between the carrier and the semiconductor devices.

3. The method of claim 1, wherein removing the semiconductor devices from the carrier comprises using at least one heat application step.

4. The method of claim 3, wherein removing the plurality or all of the semiconductor devices from the carrier further comprises applying at least one pulse of gas from the gas jet.

5. The method of claim 4, wherein the pulse is applied after using the heat application step.

6. The method of claim 1, wherein after release from the carrier the semiconductor devices are transferred to an apparatus for sorting and aligning the semiconductor devices.

7. The method of claim 1, wherein the semiconductor devices are plastic packages.

8. The method of claim 1, wherein the semiconductor devices adhere to the carrier such that an active side of the semiconductor devices faces the carrier.

9. The method of claim 1, wherein the semiconductor devices are singulated prior to removing the semiconductor devices from the carrier.

10. A method of producing semiconductor devices, the method comprising:
    arranging semiconductor devices on a thermo-release foil,
    providing an adjustable adhesive force between the thermo-release foil and the semiconductor devices,
    applying at least one mechanical or acoustical impulse to the thermo-release foil which causes detachment of at least some semiconductor devices from the thermo-release foil, and
    regulating the adhesive force between the thermo-release foil and the semiconductor devices by heating the thermo-release foil from a side where no semiconductor devices are attached, wherein the heating is performed using a hot plate.

11. The method of claim 10, wherein the at least one impulse is created using at least one air stream that is applied to the side of the thermo-release foil where no semiconductor devices are attached.

12. An apparatus for the separation of semiconductor devices from an adhesive foil, comprising:
    a supporting unit for supporting an adhesive foil having semiconductor devices adhered thereto,
    a heating system to apply heat to the adhesive foil having the semiconductor devices adhering thereto, and
    an impulse generator to apply an impulse to the adhesive foil, wherein the impulse generator comprises at least one gas nozzle designed to apply a gas jet to the adhesive foil.

13. The apparatus of claim 12, further comprising:
    a mechanical separating unit configured to remove predetermined semiconductor devices from the semiconductor devices after applying an impulse to the adhesive foil.

14. The apparatus of claim 12, further comprising:
    a reservoir to receive the semiconductor devices after mechanically separating a predetermined semiconductor devices.

15. The apparatus of claim 12, wherein the heating system and the impulse generator are arranged within a cohesive module.

16. The apparatus of claim 13, further comprising:
a vibration unit for vibrating the mechanical separating unit.

\* \* \* \* \*